(12) United States Patent
Lee (10) Patent No.: US 9,030,904 B2
(45) Date of Patent: May 12, 2015

(54) MEMORY DEVICE AND MEMORY SYSTEM HAVING PROGRAMMABLE REFRESH METHODS

(71) Applicant: SK Hynix Inc., Gyeonggi-do (KR)

(72) Inventor: Yo-Sep Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 186 days.

(21) Appl. No.: 13/714,331

(22) Filed: Dec. 13, 2012

(65) Prior Publication Data
US 2014/0064008 A1 Mar. 6, 2014

(30) Foreign Application Priority Data

Aug. 30, 2012 (KR) .................. 10-2012-0095684

(51) Int. Cl.
*G11C 7/00* (2006.01)
*G11C 11/406* (2006.01)
*G11C 29/02* (2006.01)
*G11C 29/50* (2006.01)
*G06F 1/32* (2006.01)

(52) U.S. Cl.
CPC ............... *G11C 7/00* (2013.01); *G06F 1/3203* (2013.01); *G11C 11/406* (2013.01); *G11C 11/40611* (2013.01); *G11C 11/40618* (2013.01); *G11C 29/023* (2013.01); *G11C 29/028* (2013.01); *G11C 29/50016* (2013.01)

(58) Field of Classification Search
CPC ........... G11C 11/406; G11C 11/40615; G11C 11/40618; G11C 11/40622; G11C 5/147; G11C 8/12; G06F 13/1636; G06F 1/3203; G06F 1/3275

USPC ........ 365/185.25, 189.09, 222; 711/106, 105; 713/320

See application file for complete search history.

(56) References Cited

U.S. PATENT DOCUMENTS

| 7,088,635 B2 * | 8/2006 | Hur et al. ........................ 365/222 |
| 7,844,773 B2 | 11/2010 | Sunwoo et al. |
| 2006/0256628 A1 * | 11/2006 | Kim et al. ................. 365/189.09 |
| 2011/0131432 A1 * | 6/2011 | Berke et al. .................... 713/320 |

FOREIGN PATENT DOCUMENTS

KR 1020030009065 1/2003

* cited by examiner

*Primary Examiner* — J. H. Hur
*Assistant Examiner* — Ajay Ojha
(74) *Attorney, Agent, or Firm* — IP & T Group LLP

(57) ABSTRACT

A memory device includes a plurality of memory blocks, a setting circuit configured to set a first mode, in which a first number of memory blocks are refreshed at a time, and a second mode, in which a second number of memory blocks are refreshed at a time, under control of a memory controller, the second number being smaller than the first number, a storage circuit configured to store additional refresh information, and a refresh control unit configured to control the second number of memory blocks to be refreshed at a time whenever a refresh command is applied when the additional refresh information is deactivated, and to control the first number of memory blocks to be refreshed at a time whenever the refresh command is applied when the additional refresh information is activated in a case in which the second mode is set by the setting circuit.

14 Claims, 8 Drawing Sheets

MEMORY DEVICE AND MEMORY SYSTEM HAVING PROGRAMMABLE REFRESH METHODS

CROSS-REFERENCE TO RELATED APPLICATIONS

The present application claims priority of Korean Patent Application No. 10-2012-0095684, filed on Aug. 30, 2012, which is incorporated herein by reference in its entirety.

BACKGROUND

1. Field

Exemplary embodiments of the present invention relate to a memory device, and more particularly, to a refresh technology of a memory device.

2. Description of the Related Art

A memory cell of a memory device includes a transistor serving as a switch and a capacitor for storing charge (data). A logic 'high' (logic 1) and a logic 'low' (logic 0) of data are determined according to whether charge exists in the capacitor in the memory cell, that is, whether a terminal voltage of the capacitor is high or low.

Since the storage of data represents that charge is accumulated in the capacitor, there is no power consumption in an ideal condition. However, since the initial amount of charge stored in the capacitor is removed due to leakage current caused by PN junction and the like of a MOS transistor, data may be lost. In order to substantially prevent this concern, it is necessary to read data in the memory cell before the data is lost, and to recharge a normal charge amount based on the read information. Only when such an operation is periodically repeated, the storage of data is substantially maintained. Such a recharge process of cell charge will be called a refresh operation.

The refresh operation is performed whenever a refresh command is applied from a memory controller to the memory device, wherein the memory controller applies the refresh command to the memory device at a predetermined time interval in consideration of a data retention time of the memory device. For example, in the case in which all memory cells in the memory device may be refreshed only when the data retention time of the memory device is 64 ms and the refresh command is applied 8000 times, the memory controller applies the refresh command to the memory device 8000 times for 64 ms. Meanwhile, in a test process of the memory device, a memory device having a data retention time less than a prescribed time is processed as fail. The memory device processed as fail is discarded.

SUMMARY

Exemplary embodiments of the present invention are directed to a technology of allowing a memory device having an insufficient data retention time to normally operate.

In accordance with an embodiment of the present invention, a memory device includes a plurality of memory blocks, a setting circuit configured to set a first mode, in which a first number of memory blocks are refreshed at a time, and a second mode, in which a second number of memory blocks are refreshed at a time, under control of a memory controller, the second number being smaller than the first number, a storage circuit configured to store additional refresh information, and a refresh control unit configured to control the second number of memory blocks to be refreshed at a time whenever a refresh command is applied when the additional refresh information is deactivated, and to control the first number of memory blocks to be refreshed at a time whenever the refresh command is applied when the additional refresh information is activated in a case in which the second mode is set by the setting circuit.

In accordance with another embodiment of the present invention, a memory system includes a memory device including a plurality of memory blocks a setting circuit configured to set a first mode, in which a first number of memory blocks are refreshed at a time, and a second mode, in which a second number of memory blocks are refreshed at a time, according to a setting information, the second number being smaller than the first number, and a refresh control unit configured to control the second number of memory blocks to be refreshed at a time whenever a refresh command is applied when the additional refresh information is deactivated, and to control the first number of memory blocks to be refreshed at a time whenever the refresh command is applied when the additional refresh information is activated in a case in which the second mode is set by the setting circuit, and a memory controller configured to apply the setting information to the memory device and periodically apply the refresh command.

In accordance with another embodiment of the present invention, a memory device includes a command input unit, an address input unit, a plurality of memory blocks, a command decoder configured to decode a command input through the command input unit and generate a setting command and a refresh command, a setting circuit configured to set a first mode, in which a first number of memory blocks are refreshed at a time, and a second mode, in which a second number of memory blocks are refreshed at a time, in response to an address input through the address input unit at a time of activation of the setting command, the second number being smaller than the first number, a storage circuit configured to store additional refresh information, and a refresh control unit configured to control the second number of memory blocks to be refreshed at a time whenever the refresh command is activated when the additional refresh information is deactivated, and to control the first number of memory blocks to be refreshed at a time whenever the refresh command is applied when the additional refresh information is activated in a case in which the second mode is set by the setting circuit.

According to the present invention, in a memory device having a short data retention time, a refresh mode is changed such that many memory banks are refreshed at a time whenever a refresh command is applied. Consequently, even the memory device having a short data retention time may not be processed as fail.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
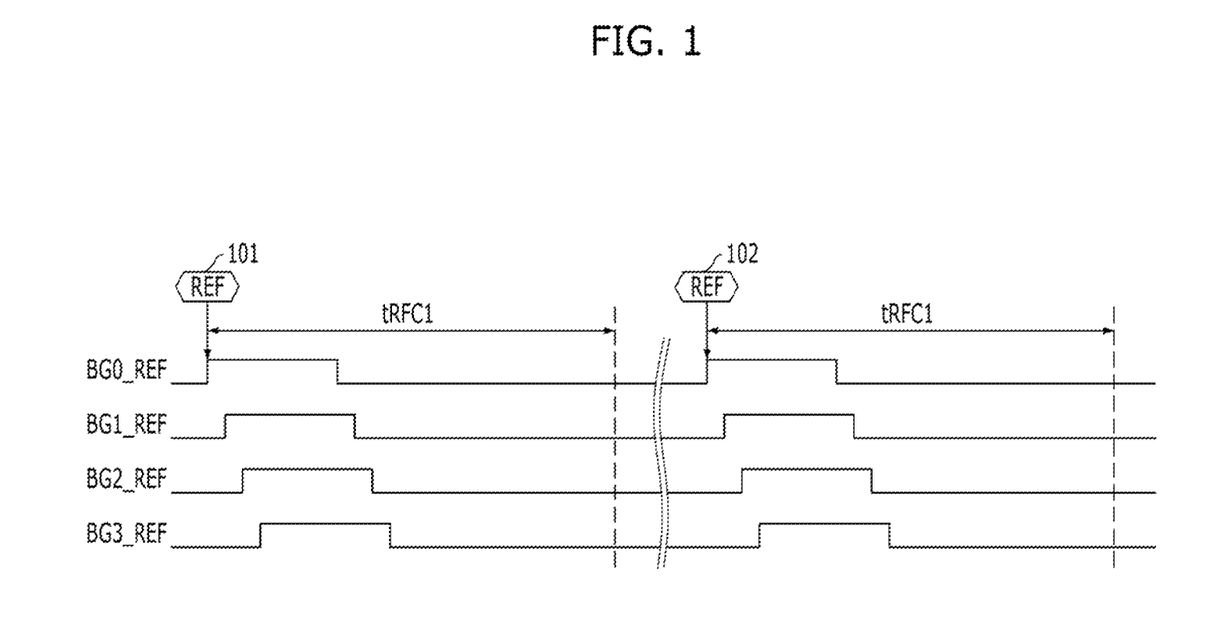
FIG. 1 is a diagram illustrating a refresh operation of a memory device when a refresh mode is set as a first mode.
Figure 2:
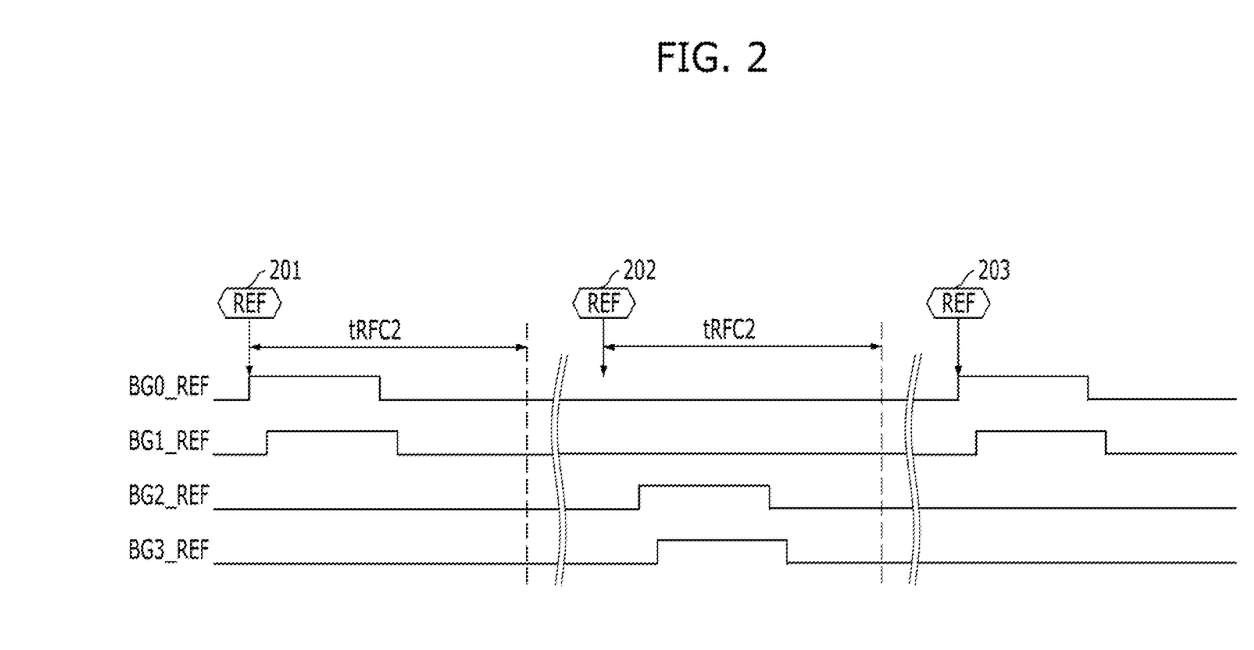
FIG. 2 is a diagram illustrating a refresh operation of a memory device when a refresh mode is set as a second mode.
Figure 3:
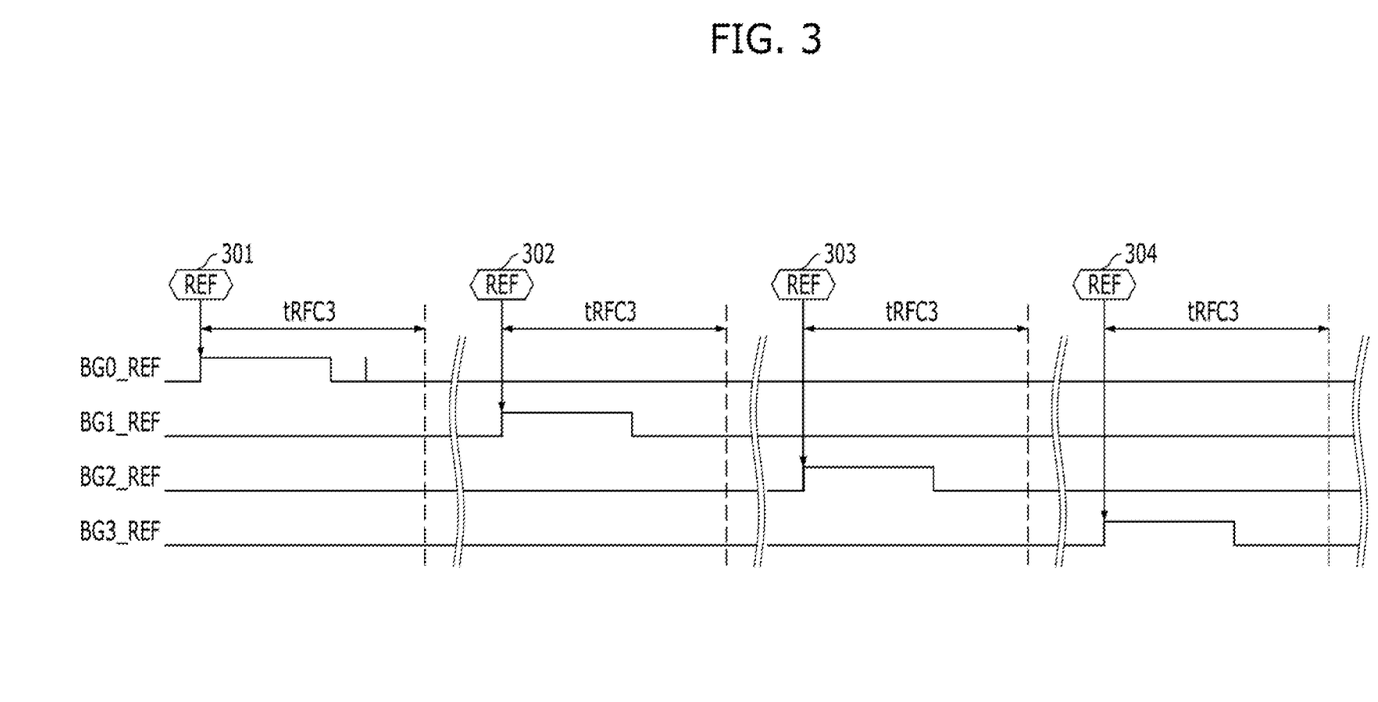
FIG. 3 is a diagram illustrating a refresh operation of a memory device when a refresh mode is set as a third mode.

FIG. 1 to FIG. 3 are diagrams for explaining a refresh operation of a memory device in a refresh mode.

FIG. 1 illustrates the refresh operation of the memory device when the refresh mode is set as a first mode. The first mode may be a fine granularity refresh (FGR) 1 mode. In the first mode, whenever a refresh command is applied to the memory device, one row is refreshed in all bank groups, respectively. Referring to FIG. 1, as a refresh command 101 is applied, bank group 0 to bank group 3 are refreshed. Furthermore, BG0_REF to BG3_REF of FIG. 1 indicate that a corresponding bank group is refreshed. Furthermore, as a refresh command 102 is applied, the bank group 0 to the bank group 3 are refreshed. When the refresh command 102 is applied, a row, which is next to a row refreshed when the refresh command 101 is applied, is refreshed. For example, in the case in which the refresh command 101 is applied and $100^{th}$ rows of the bank group 0 to the bank group 3 is refreshed, when the refresh command 102 is applied, $101^{st}$ rows of the bank group 0 to the bank group 3 are refreshed. In the first mode, since all bank groups are refreshed in response to a one-time refresh command, a refresh operation period, that is, tRFC (refresh cycle) is set to be relatively large. Furthermore, the BG0_REF to the BG3_REF are activated while substantially maintaining a small time difference, which is for reducing a peak current due to the refresh operation. In an embodiment different from FIG. 1, the BG0_REF to the BG3_REF may be simultaneously activated.

FIG. 2 illustrates the refresh operation of the memory device when the refresh mode is set as a second mode. The second mode may be a FGR 2 mode. In the second mode, whenever a refresh command is applied to the memory device, one row is refreshed in a half of all bank groups, respectively. Referring to FIG. 2, as a refresh command 201 is applied, bank group 0 and bank group 1 are refreshed, and as a refresh command 202 is applied, bank group 2 and bank group 3 are refreshed. When a refresh command 203 is applied after the refresh command 202, the bank group 0 and the bank group 1 are refreshed again. At is time, rows refreshed in the bank group 0 and the bank group 1 are rows next to the rows refreshed when the refresh command 201 is applied. In the second mode, since the half of all bank groups is refreshed in response to a one-time refresh command, a refresh operation period, that is, tRFC may be set to be smaller than that of the first mode.

FIG. 3 illustrates the refresh operation of the memory device when the refresh mode is set as a third mode. The third mode may be a FGR 4 mode. In the third mode, whenever a refresh command is applied to the memory device, one row is refreshed in a quarter of all bank groups. Referring to FIG. 3, as a refresh command 301 is applied, bank group 0 is refreshed, and as a refresh command 302 is applied, bank group 1 is refreshed. Then, as a refresh command 303 is applied, bank group 2 is refreshed, and a refresh command 304 is applied, bank group 3 is refreshed. When a refresh command (not illustrated) is applied after the refresh command 304, the bank group 0 is refreshed again. At this time, a row refreshed in the bank group 0 is a row next to the row refreshed when the refresh command 301 is applied. In the third mode, since the quarter of all bank groups is refreshed in response to a one-time refresh command, a refresh operation period, that is, tRFC is set to be smaller than that of the second mode.

Figure 4:
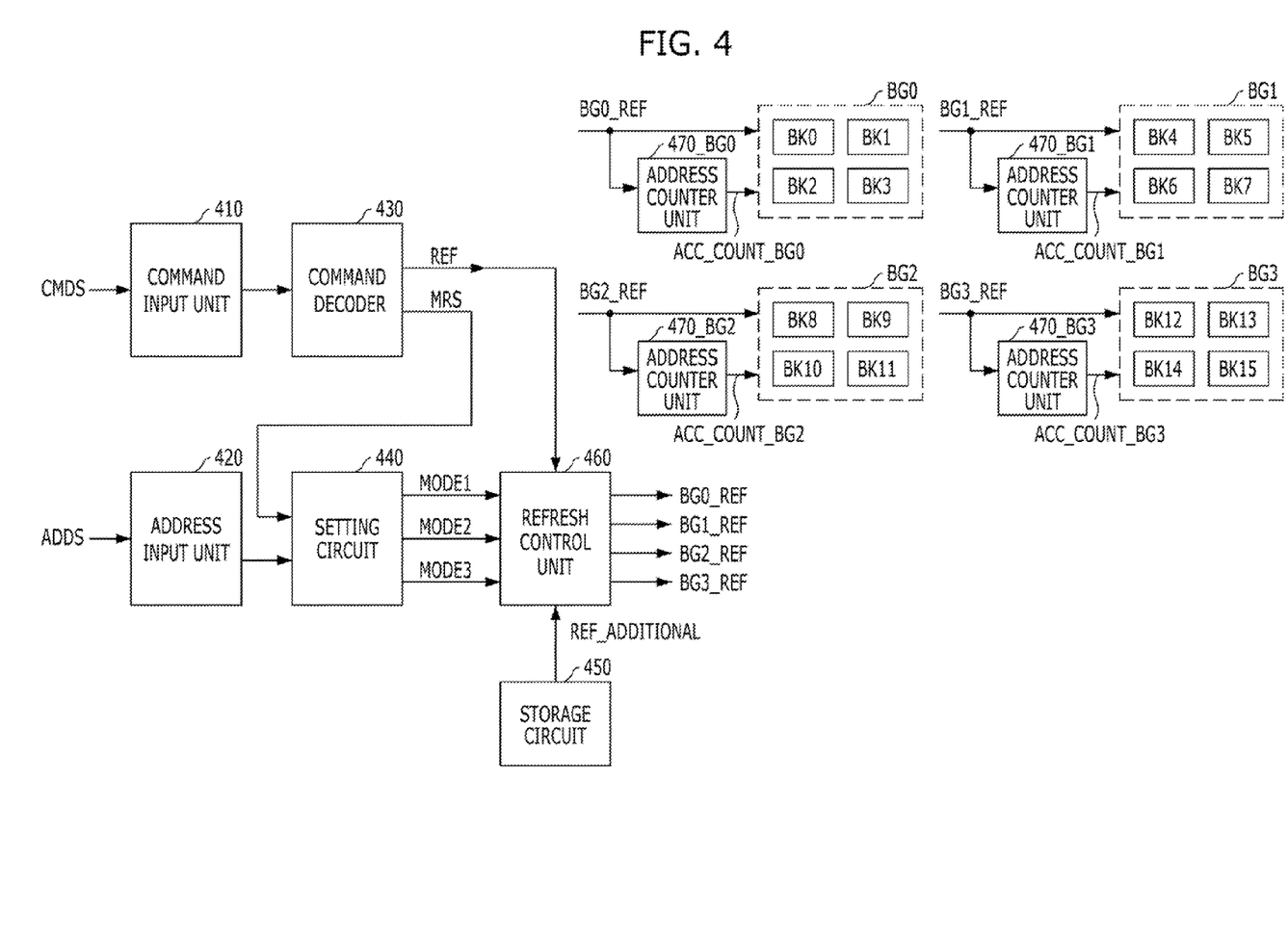
FIG. 4 is a block diagram of a memory device in accordance with an embodiment of the present invention.

FIG. 4 is a block diagram illustrating a memory device in accordance with an embodiment of the present invention.

Referring to FIG. 4, the memory device includes a command input unit 410, an address input unit 420, a command decoder 430, a setting circuit 440, a storage circuit 450, a refresh control unit 460, address counter units 470_BG0 to 470_BG3, and bank groups BG0 to BG3. FIG. 4 illustrates only a configuration for setting a refresh mode in the memory device and only a configuration related to a refresh operation, and a configuration regarding an operation (for example, a read operation, a write operation and the like) directly not related to the embodiment of the present invention is not illustrated.

The command input unit 410 is configured to receive commands CMDS applied from the memory controller, and the address input unit 420 is configured to receive addresses ADDS applied from the memory controller. The commands CMDS and the addresses ADDS include multi-bit signals, respectively.

The command decoder 430 is configured to decode the commands CMDS input through the command input unit 410 and generate a setting command (MRS: mode register set) and a refresh command REF. When a combination of the input command signals CMDS corresponds to the setting command MRS, the command decoder 430 activates the setting command MRS, and when the combination of the input command signals CMDS corresponds to the refresh command REF, the command decoder 430 activates the refresh command REF. In addition, the command decoder 430 decodes the input command signals CMDS to generate active, precharge, read, write commands and the like, but since these are not directly related to the embodiment of the present invention, illustration and description thereof win be omitted.

The address counter units 470_BG0 to 470_BG3 are configured to be provided to the bank groups BG0 to BG3, respectively, to count addresses ADD_COUNT_BG0 to ADD_COUNT_BG3 to be used in a refresh operation of a corresponding bank group. The address counter units 470_BG0 to 470_BG3 are configured to increase the values of the addresses ADD_COUNT_BG0 to ADD_COUNT_BG3 by one whenever refresh signals BG0_REF to BG3_REF corresponding to the address counter units 470_BG0 to 470_BG3 are activated. For example, the address counter unit 470_BG0 increases the value of the address ADD_COUNT_BG0 by one whenever the refresh signal BG0_REF is activated, and the address counter unit 470_BG2 increases the value of the address ADD_COUNT_BG2 by one whenever the refresh signal BG2_REF is activated. An increase in the value of the address by one represents a change in an address such that a $N+1^{th}$ row is selected next time when a $N^{th}$ row has been selected before.

In the embodiment, the address counter units 470_BG0 to 470_BG3 are separately provided to the bank groups BG0 to BG3, respectively. However, one address counter may be shared by all bank groups. For example, the memory device may be designed such that the memory device includes only the address counter unit 470_BG0 for increasing the address ADD_COUNT_BG0 in response to the refresh signal BG0_REF, and all the bank groups BG0 to BG3 perform the refresh operation in response to the address ADD_COUNT_BG0 output from the address counter units 470_BG0 to 470_BG3.

Each of the bank groups BG0 to BG3 includes one or more banks. FIG. 4 illustrates that 16 banks BK0 to BK15 exist in the memory device, and four banks is grouped into one group, so that the total of four bank groups BG0 to BG3 are formed. However, the number of bank groups and the number of banks may be changed according to design considerations. The bank groups BG0 to BG3 are refreshed in response to the refresh signals BG0_REF to BG3_REF corresponding to the bank groups BG0 to BG3. For example, when the refresh signal BG0_REF is activated, a row selected by the address ADD_COUNT_BG0 in all the banks BK0 to BK3 in the bank group BG0 is refreshed. Similarly, when the refresh signal BG2_REF is activated, a row selected by the address ADD_COUNT_BG2 in all banks BK8 to BK11 in the bank group BG2 is refreshed.

The setting circuit 440 is configured to set a refresh mode using the addresses ADDS input through the address input unit 420 at the time of activation of the setting command MRS. The refresh mode may include a first mode, a second mode, and a third mode. The refresh mode set by the setting circuit 440 is a refresh mode instructed by the memory controller. A signal MODE1 output from the setting circuit 440 indicates that setting of the first mode is instructed by the memory controller, a signal MODE2 indicates that setting of the second mode is instructed by the memory controller, and a signal MODE3 indicates that setting of the third mode is instructed by the memory controller.

The storage circuit 450 is configured to store additional refresh information REF_ADDITIONAL. The additional refresh information REF_ADDITIONAL indicates whether a data retention time of the memory device satisfies a prescribed time (for example, a time required by the memory standard specifications). After a memory device is fabricated, when a data retention time measured in a test process does not reach the prescribed time, the additional refresh information REF_ADDITIONAL is activated and stored. Furthermore, when the data retention time measured in the test process exceeds the prescribed time, the additional refresh information REF_ADDITIONAL is deactivated and stored. That is, if a memory device is classified into a failed chip due to an insufficient data retention time in the conventional art, the additional refresh information REF_ADDITIONAL is activated and stored. If a memory device has a sufficient data retention time, the additional refresh information REF_ADDITIONAL is deactivated and stored. Since the additional refresh information REF_ADDITIONAL stored in the storage circuit 450 needs to continuously maintain a value after the test process, the storage circuit 450 may include a laser fuse, an e-fuse, or a nonvolatile memory such as a flash memory.

The refresh control unit 460 is configured to control the refresh operation of the memory device in response to the modes MODE1 to MODE3 set by the setting circuit, the additional refresh information REF_ADDITIONAL stored in the storage circuit, and the refresh command REF. The refresh operation is controlled by activating the refresh signals BG0_REF to BG3_REF. Hereinafter, the operation of the refresh control unit 460 when the additional refresh information REF_ADDITIONAL is activated and when the additional refresh information REF_ADDITIONAL is deactivated will be described.

First, when the additional refresh information REF_ADDITIONAL is deactivated, the refresh control unit 460 activates the refresh signals BG0_REF to BG3_REF and controls the refresh operation of the memory device according to the modes set by the setting circuit 440, that is, as illustrated in FIG. 1 to FIG. 3. When the first mode is set by the setting circuit 440, that is, when the signal MODE1 is activated, the refresh control unit 460 may control all the bank groups to be refreshed whenever the refresh command REF is activated as shown in FIG. 1. When the second mode is set by the setting circuit 440, that is, when the signal MODE2 is activated, the refresh control unit 460 may control a half of the bank groups to be refreshed whenever the refresh command REF is activated as shown in FIG. 2. When the third mode is set by the setting circuit 440, that is, when the signal MODE3 is activated, the refresh control unit 460 may control a quarter of the bank groups to be refreshed whenever the refresh command REF is activated as shown in FIG. 3. As a consequence, when the additional refresh information REF_ADDITIONAL is deactivated, the memory device is refreshed similarly to the modes set by the memory controller.

When the additional refresh information REF_ADDITIONAL is activated, the refresh control unit 460 may control the memory device such that the refresh operation is performed in many bank groups as compared with the refresh mode set by the setting circuit 440. This will be described with reference to FIG. 5 to FIG. 7.

Figure 5:
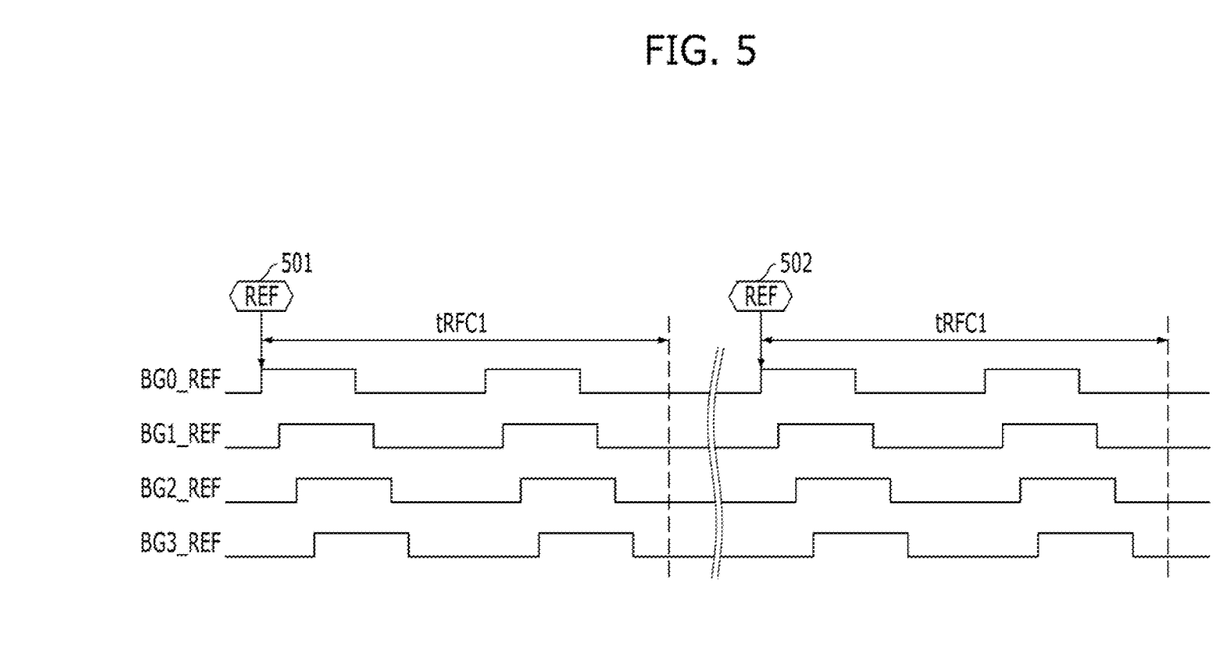
FIG. 5 is a diagram illustrating a refresh operation of a memory device when a first mode is set by a setting circuit 440 and additional refresh information REF_ADDITIONAL has been activated.

FIG. 5 illustrates the refresh operation of the memory device when the first mode is set by the setting circuit 440 and the additional refresh information REF_ADDITIONAL is activated. When the first mode is set (MODE1 activation) and the additional refresh information REF_ADDITIONAL is activated, the refresh control unit 460 activates the refresh signals BG0_REF to BG3_REF corresponding to all the bank groups BG0 to BG3 twice whenever the refresh command REF is activated. Referring to FIG. 5, the refresh signals BG0_REF to BG3_REF are activated twice in response to a refresh command 501, and the refresh signals BG0_REF to BG3_REF are activated twice in response to a refresh command 502. Since a refresh operation period tRFC1 in the first mode is set to be sufficiently long, even when the refresh signals BG0_REF to BG3_REF are activated twice whenever the refresh commands 501 and 502 are activated, they may not escape from the refresh operation period.

Figure 6:
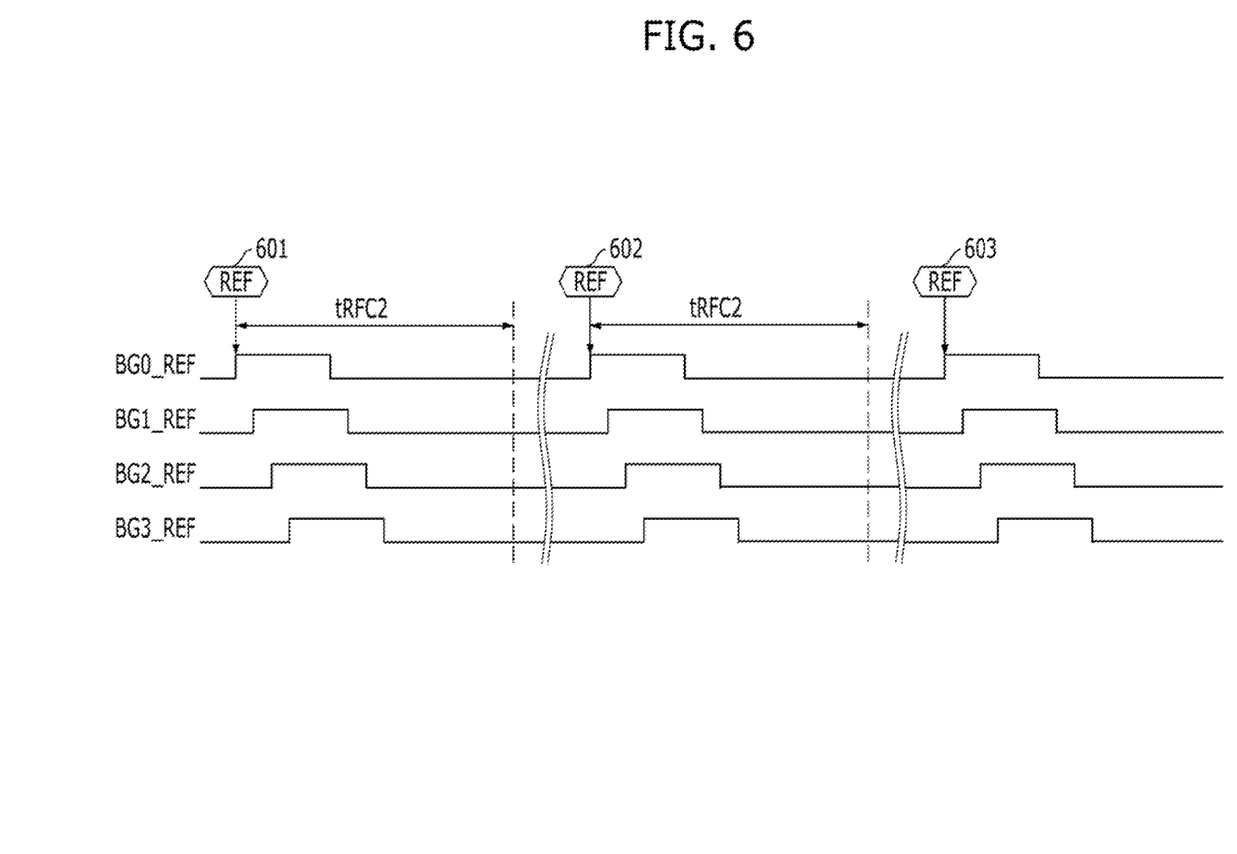
FIG. 6 is a diagram illustrating a refresh operation of a memory device when a second mode is set by a setting circuit 440 and additional refresh information REF_ADDITIONAL has been activated.

FIG. 6 illustrates the refresh operation of the memory device when the second mode is set by the setting circuit 440 and the additional refresh information REF_ADDITIONAL is activated. When the second mode is set (MODE2 activation) and the additional refresh information REF_ADDITIONAL is activated, the refresh control unit 460 may control the refresh operation similar to the case in which the first mode is set. Referring to FIG. 6, the refresh signals BG0_REF to BG3_REF of all the bank groups BG0 to BG3 are activated in response to a refresh command 601, and the refresh signals BG0_REF to BG3_REF of all the bank groups BG0 to BG3 are activated in response to a refresh command 602. Furthermore, the refresh signals BG0_REF to BG3_REF of all the bank groups BG0 to BG3 are activated in response to a refresh command 603. That is, when the additional refresh information REF_ADDITIONAL is activated, the refresh operation of the memory device operates similarly to the case in which the first mode, other than the second mode, is set by the memory controller. Even when the number of refresh signals activated per one refresh command is increased, they may not escape from a refresh operation period tRFC2 in the second mode.

Figure 7:
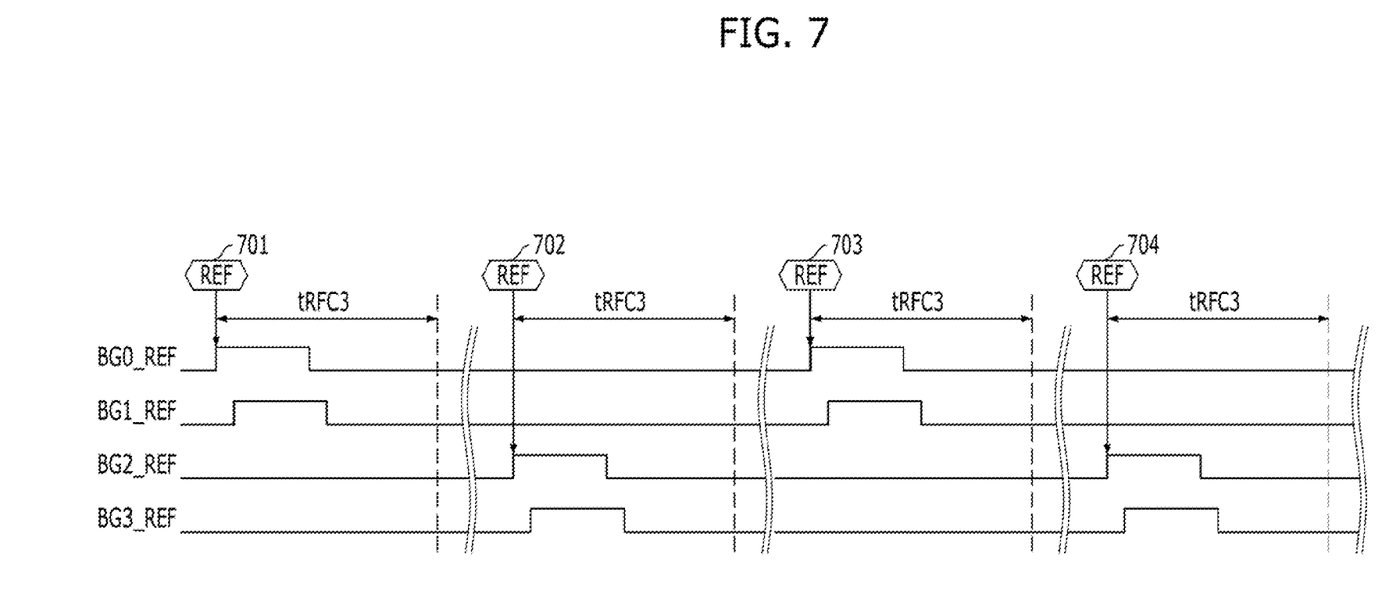
FIG. 7 is a diagram illustrating a refresh operation of a memory device when a third mode is set by a setting circuit 440 and additional refresh information REF_ADDITIONAL has been activated.

FIG. 7 illustrates the refresh operation of the memory device when the third mode is set by the setting circuit 440 and the additional refresh information REF_ADDITIONAL is activated. When the third mode is set (MODE3 activation) and the additional refresh information REF_ADDITIONAL is activated, the refresh control unit 460 may control the refresh operation similar to the case in which the second mode is set. Referring to FIG. 7, the refresh signals BG0_REF and BG1_REF of BG0 and BG1 of all the bank groups BG0 to BG3 are activated in response to a refresh command 701, and the refresh signals BG2_REF and BG3_REF of BG2 and BG3 of all the bank groups BG0 to BG3 in response to a refresh command 702. Furthermore, the refresh signals BG0_REF and BG1_REF are activated in response to a refresh command 703, and the refresh signals BG2_REF and BG3_REF are activated in response to a refresh command 704.

As described in FIG. 5 to FIG. 7, when the additional refresh information REF_ADDITIONAL is activated, the refresh signals BG0_REF to BG3_REF are activated more times in the memory device as compared with the cases of FIG. 1 to FIG. 3. Consequently, a memory device having an insufficient data retention time (a memory device to be processed as fail) becomes available by activating the additional refresh information REF_ADDITIONAL.

Figure 8:
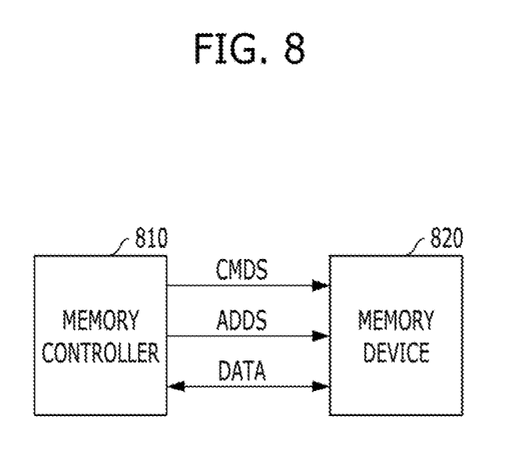
FIG. 8 is a block diagram of a memory system in accordance with an embodiment of the present invention.

FIG. 8 is a configuration diagram of a memory system in accordance with an embodiment of the present invention.

As illustrated in FIG. 8, the memory system includes a memory controller 810 and a memory device 820.

The memory controller 810 is configured to control the operation of the memory device 820 by applying commands CMDS and addresses ADDS to the memory device 820, and to exchange data DATA with the memory device 820 in read and write operations. A refresh mode of the memory device 820 may be set by transmitting the commands CMDS and the addresses ADDS to the memory device 820, and a refresh command may be applied to the memory device 820 by transmitting the commands CMDS. In the refresh operation, since addresses ADD_COUNT_BG0 to ADD_COUNT_BG3 internally generated by the memory device 820 are used, it is not necessary for the memory controller 810 to transmit the addresses ADDS to the memory device 820.

The memory device 820 (FIG. 4) is configured to receive the commands CMDS and the addresses ADDS and set the refresh mode. Then, the memory device 820 performs the refresh operation in response to the refresh command applied through the commands CMDS. A method for performing the refresh operation is determined by refresh modes MODE1 to MODE3 and additional refresh information REF_ADDITIONAL internally stored. Meanwhile, when read and write commands are applied from the memory controller 810, the memory device 820 exchange data DATA with the memory controller 810.

While the present invention has been described with respect to the specific embodiments, it will be apparent to those skilled in the art that various changes and modifications may be made without departing from the spirit and scope of the invention as defined in the following claims.

What is claimed is:

1. A memory device comprising:
a plurality of memory blocks;
a setting circuit configured to set a first mode, in which a first number of memory blocks are refreshed at a time, and a second mode, in which a second number of memory blocks are refreshed at a time, under control of a memory controller, the second number being smaller than the first number;
a storage circuit configured to store additional refresh information; and
a refresh control unit configured to control the first number of memory blocks to be refreshed when the additional refresh information is activated, and to control the second number of memory blocks to be refreshed when the additional refresh information is deactivated whenever a refresh command is executed in which the second mode is set by the setting circuit,
wherein, activation and deactivation of the additional refresh information is determined by a data retention time of the memory device.

2. The memory device of claim 1, wherein the setting circuit is configured to set a third mode in which a third number of memory blocks are refreshed at a time, the third number being smaller than the second number, and
the refresh control unit is configured to control the third number of memory blocks to be refreshed at a time when the additional refresh information is deactivated, and to control the second number of memory blocks to be refreshed at a time when the additional refresh information is activated whenever the refresh command is executed in which the third mode has been set by the setting circuit.

3. The memory device of claim 1, wherein each of the plurality of memory blocks includes a memory bank.

4. The memory device of claim 1, wherein the storage circuit includes a nonvolatile storage element.

5. The memory device of claim 1, wherein the data retention time is measured in a fabrication process of the memory device.

6. A memory device comprising:
a plurality of memory blocks;
a setting circuit configured to set a first mode, in which a first number of memory blocks are refreshed at a time, and a second mode, in which a second number of memory blocks are refreshed at a time, under control of a memory controller, the second number being smaller than the first number;
a storage circuit configured to store additional refresh information; and
a refresh control unit configured to control the first number of memory blocks to be refreshed when the additional refresh information is activated, and to control the second number of memory blocks to be refreshed when the additional refresh information is deactivated whenever a refresh command is executed in which the second mode is set by the setting circuit,
wherein, in a case in which the first mode is set by the setting circuit, if the additional refresh information is deactivated, the refresh control unit controls the first number of memory blocks to be refreshed at a time whenever the refresh command is executed, and if the additional refresh information is activated, the refresh control unit controls the first number of memory blocks to be refreshed twice at a time whenever the refresh command is executed.

7. The memory device of claim 6, wherein the first number is substantially equal to a number of the plurality of memory blocks.

8. A memory system comprising:
a memory device including a plurality of memory blocks, a setting circuit configured to set a first mode, in which a first number of memory blocks are refreshed at a time, and a second mode, in which a second number of memory blocks are refreshed at a time, according to a setting information, the second number being smaller than the first number, and a refresh control unit configured to control the first number of memory blocks to be refreshed when additional refresh information is activated, and to control the second number of memory blocks to be refreshed when the additional refresh information is deactivated whenever a refresh command is executed in which the second mode is set by the setting circuit; and
a memory controller configured to apply the setting information to the memory device and periodically apply the refresh command,
wherein, activation and deactivation of the additional refresh information is determined by a data retention time of the memory device.

9. The memory system of claim 8, wherein the setting circuit is configured to set a third mode in which a third number of memory blocks are refreshed at a time the third number being smaller than the second number, and
the refresh control unit is configured to control the third number of memory blocks to be refreshed at a time when the additional refresh information is deactivated, and to control the second number of memory blocks to be refreshed at a time when the additional refresh information is activated whenever the refresh command is executed in which the third mode is set by the setting circuit.

10. The memory system of claim 8, wherein, in a case in which the first mode is set by the setting circuit, if the additional refresh information is deactivated, the refresh control unit controls the first number of memory blocks to be refreshed at a time whenever the refresh command is executed, and if the additional refresh information is activated, the refresh control unit controls the first number of memory blocks to be refreshed twice at a time whenever the refresh command is executed.

11. A memory device comprising:
a command input unit;
an address input unit;
a plurality of memory blocks;
a command decoder configured to decode a command input through the command input unit and generate a setting command and a refresh command;
a setting circuit configured to set a first mode, in which a first number of memory blocks are refreshed at a time, and a second mode, in which a second number of memory blocks are refreshed at a time, in response to an address input through the address input unit at a time of activation of the setting command, the second number being smaller than the first number;
a storage circuit configured to store additional refresh information; and
a refresh control unit configured to control the first number of memory blocks to be refreshed when the additional refresh information is activated, and to control the second number of memory blocks to be refreshed when the additional refresh information is deactivated whenever a refresh command is executed in which the second mode is set by the setting circuit,
wherein, activation and deactivation of the additional refresh information is determined by a data retention time of the memory device.

12. The memory device of claim 11, wherein the setting circuit is configured to set a third mode in which a third number of memory blocks are refreshed at a time, the third number being smaller than the second number, and
the refresh control unit is configured to control the third number of memory blocks to be refreshed at a time when the additional refresh information is deactivated, and to control the second number of memory blocks to be refreshed at a time when the additional refresh information is activated whenever the refresh command is executed in which the third mode is set by the setting circuit.

13. The memory device of claim 11, wherein, in a case in which the first mode is set by the setting circuit, if the additional refresh information is deactivated, the refresh control unit controls the first number of memory blocks to be refreshed at a time whenever the refresh command is executed, and if the additional refresh information is activated, the refresh control unit controls the first number of memory blocks to be refreshed twice at a time whenever the refresh command is executed.

14. The memory device of claim 11, wherein the setting command includes a mode register set command.

* * * * *